(12) United States Patent
Togashi

(10) Patent No.: US 7,113,057 B2
(45) Date of Patent: Sep. 26, 2006

(54) NOISE FILTER

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 34 days.

(21) Appl. No.: 10/916,478

(22) Filed: Aug. 12, 2004

(65) Prior Publication Data

US 2005/0046516 A1    Mar. 3, 2005

(30) Foreign Application Priority Data

Aug. 29, 2003  (JP) .............................. 2003-305996

(51) Int. Cl.
*H03H 7/01*    (2006.01)
(52) U.S. Cl. ...................................... 333/181; 333/185
(58) Field of Classification Search ................ 333/181, 333/184, 185; 361/301.04, 304, 328, 306.1, 361/306.3
See application file for complete search history.

(56) References Cited

U.S. PATENT DOCUMENTS

| | | | | |
|---|---|---|---|---|
| 4,590,537 | A | * | 5/1986 | Sakamoto ................ 361/306.3 |
| 5,668,511 | A | * | 9/1997 | Furutani et al. ............ 333/204 |
| 6,292,351 | B1 | * | 9/2001 | Ahiko et al. ............. 361/306.3 |
| 6,727,782 | B1 | * | 4/2004 | Sasaki et al. ............... 333/185 |

FOREIGN PATENT DOCUMENTS

| | | |
|---|---|---|
| GB | 2383198 A  *  6/2003 | |
| JP | 6-53047 | 2/1994 |
| JP | 8-316100 | 11/1996 |
| JP | 9-55335 | 2/1997 |
| JP | 2657953 | 6/1997 |

* cited by examiner

*Primary Examiner*—Seungsook Ham
(74) *Attorney, Agent, or Firm*—Oblon, Spivak, McClelland, Maier & Neustadt, P.C.

(57) ABSTRACT

A noise filter includes: a dielectric element formed of a stack of dielectric layers; a pair of first terminal electrodes disposed on one face of the dielectric element and each connectable to an external circuit; a second terminal electrode disposed on the face on which the pair of first terminal electrodes exist, and connectable to the external circuit; a pair of first internal conductors having bent portions respectively and disposed in the dielectric element with both ends thereof being led out outside the dielectric element and with the ends thereof on one side being individually connected to the pair of first terminal electrodes; a coupling electrode disposed on a face of the dielectric element and connecting the other ends of the pair of first internal conductors to each other on an outer face of the dielectric element; and a second internal conductor which is arranged at least between the pair of first internal conductors in the dielectric element, being separated from the pair of first internal conductors by dielectric layers, and whose one end is led out to the face of the dielectric element to be connected to the second terminal electrode. Therefore, a noise filter with an improved noise filtering effect can be obtained.

11 Claims, 15 Drawing Sheets

F I G. 9 (A)
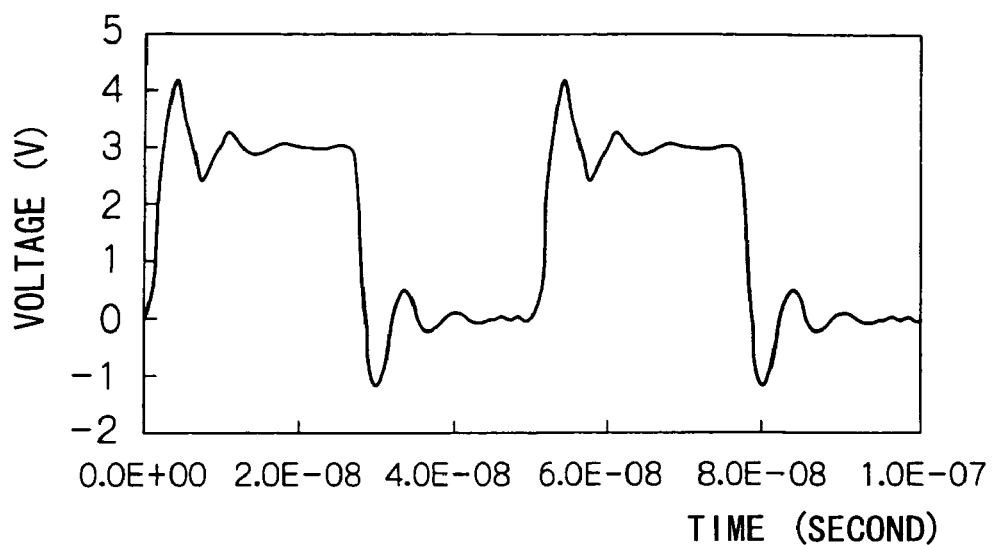
F I G. 9 (B)
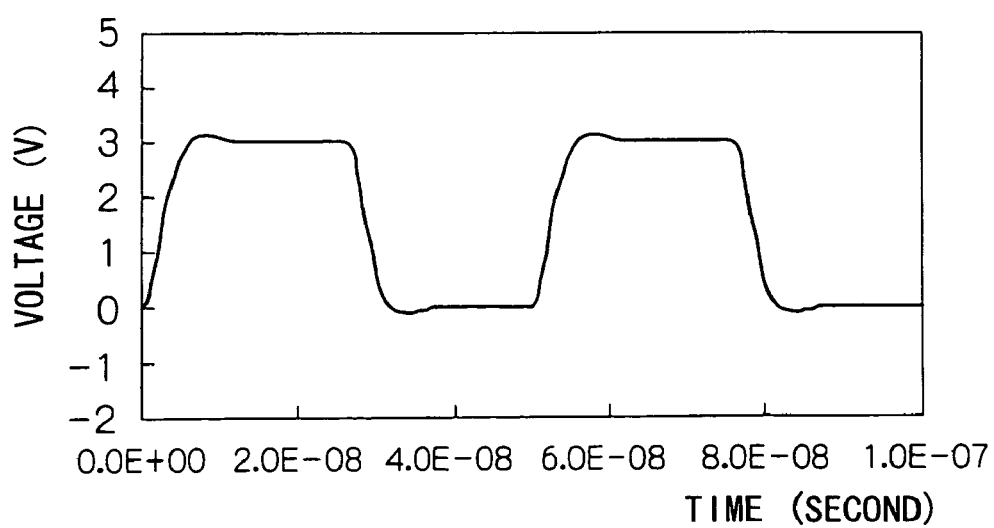

F I G. 1 9
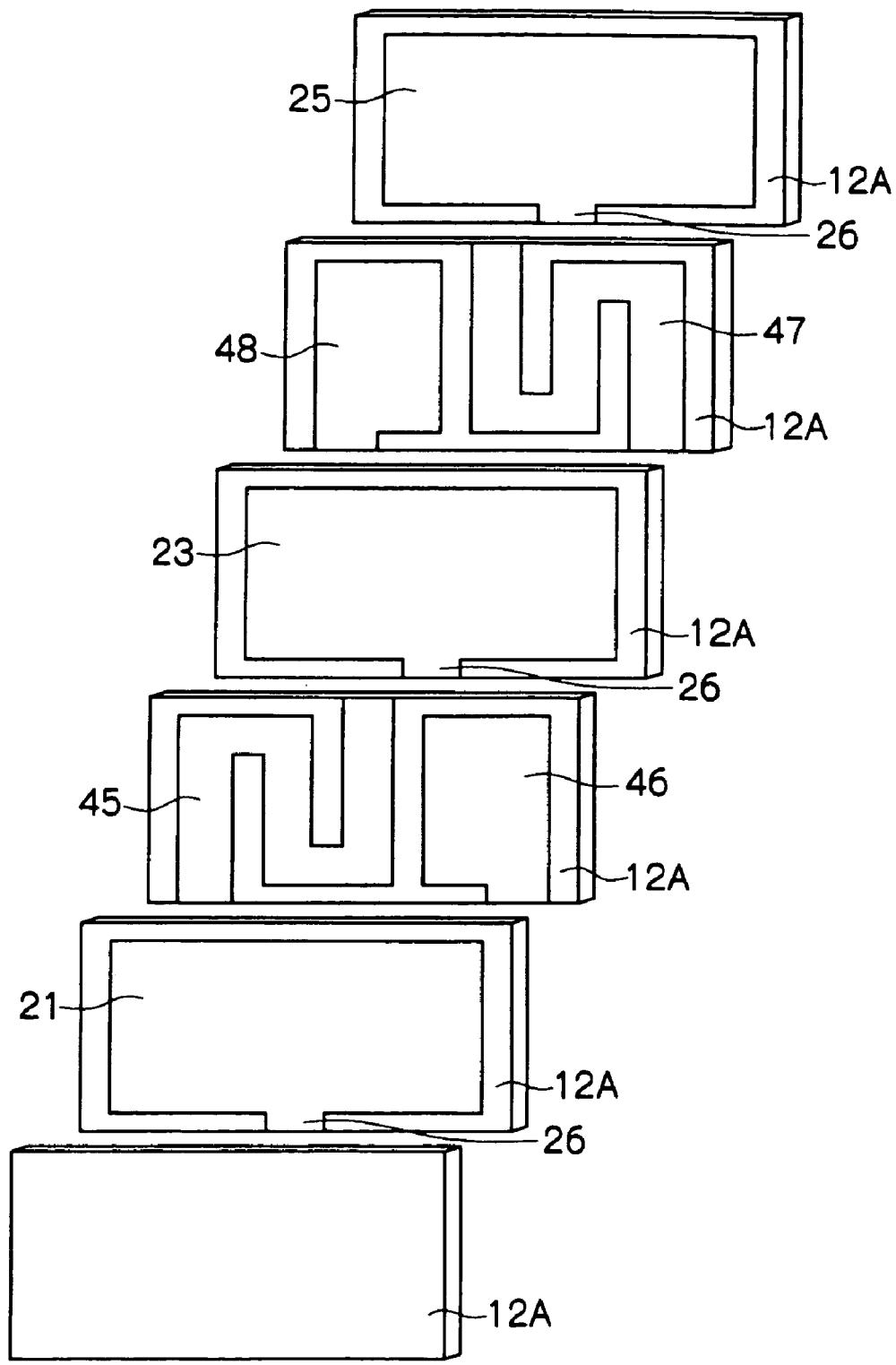

NOISE FILTER

BACKGROUND OF THE INVENTION

1. Field of the Invention

The present invention relates to a noise filter with an improved noise filtering effect whose basic structure is a feedthrough capacitor and which is imparted an effect of a distributed constant filter, and more particularly, to that suitable for use in a circuit of data processing equipment and communication equipment.

2. Description of the Related Art

Electronic equipment such as data processing equipment and communication equipment in recent years is mostly digitalized, and further, the frequency of digital signals handled in these equipments is becoming higher in accordance with the increased speed of data processing capability. Accordingly, noises generated from these equipments similarly tend to increase in a high-frequency range. As a noise countermeasure, many of these equipments use electronic components for preventing electromagnetic interference and inhibiting unnecessary voltage fluctuation. Multilayer feedthrough capacitors are in general use as such electronic components for noise countermeasure.

Here, a multilayer feedthrough capacitor 110 being a multilayered type feedthrough capacitor for noise countermeasure, which is shown in FIG. 21 to FIG. 23, will be described below.

As shown in FIG. 22(A), FIG. 22(B), and FIG. 22(C) the multilayer feedthrough capacitor 110 has one dielectric sheet 122 on which a first internal conductor 112 led out to two side faces opposite to each other and serving as a signal conductor is disposed, and two dielectric sheets 124 on each of which a second internal conductor 114 led out to two side faces different from the abovementioned two side faces and serving as a grounding conductor is disposed. These dielectric sheet 122 and dielectric sheets 124 are stacked to form a multilayer body 120 shown in FIG. 21.

Further, a pair of terminal electrodes 132A, 132B both connected to the first internal conductors 112 are disposed on both ends of the multilayer body 120, and a pair of terminal electrodes 134A, 134B both connected to the second internal conductors 114 are disposed on both side faces of the multilayer body 120. Accordingly, the pair of terminal electrodes 132A, 132B are connectable to a signal line side and the pair of terminal electrodes 134A, 134B are connectable to a ground side. In the multilayer feedthrough capacitor 110, the first internal conductors 112 and the second internal conductors 114 constitute a capacitor C as in an equivalent circuit diagram shown in FIG. 23.

However, the frequency handled in recent electronic equipment has become remarkably higher, which further increases noises, and the lowered power consumption of the electronic equipment lowers operating voltage. Consequently, noise resistance of the electronic equipment is deteriorating. Under such circumstances, multilayer feedthrough capacitors have been used in many electronic equipments and have exhibited an effect as noise filters which are electronic components for noise countermeasure, but there has arisen a demand for a higher noise filtering effect.

SUMMARY OF THE INVENTION

In view of the above-described situation, it is an object of the present invention to provide a noise filter with an improved noise filtering effect.

According to one of the modes of the present invention, provided is a noise filter including: a dielectric element formed of a stack of dielectric layers; a pair of first terminal electrodes disposed on one face of the dielectric element and each connectable to an external circuit; a second terminal electrode disposed on the face on which the pair of first terminal electrodes exist and connectable to the external circuit; a pair of first internal conductors having bent portions respectively and disposed in the dielectric element with both ends thereof being led out outside the dielectric element and with the respective ends thereof on one side being individually connected to the pair of first terminal electrodes; a coupling electrode disposed on a face of the dielectric element and connecting the other ends of the pair of first internal conductors to each other on an outer face of the dielectric element; and a second internal conductor which is arranged at least between the pair of first internal conductors in the dielectric element, being separated from the pair of first internal conductors by the dielectric layers, and whose one end is led out to the face of the dielectric element to be connected to the second terminal electrode.

Such a noise filter has the following operation.

According to the multilayer capacitor of this mode, the pair of first internal conductors having the bent portions with both ends thereof being led out outside the dielectric element and the second internal conductor existing at least between the pair of first internal conductors, being separated from the pair of first internal conductors by the dielectric layers, are arranged in the dielectric element formed of a stack of the dielectric layers.

Further, the respective ends on one side of the pair of first internal conductors are individually connected to the pair of first terminal electrodes that are disposed on one face of the dielectric element to be connectable to the external circuit. The coupling electrode disposed on the face of the dielectric element connects the other ends of the pair of first internal conductors to each other on the outer face of the dielectric element. One end of the second internal conductor is led out to be connected to the second terminal electrode that is disposed on the face of the dielectric element on which the pair of first terminal electrodes exist and that is connectable to the external circuit.

Therefore, in this mode, capacitance is obtained by the dielectric layers interposed between the pair of first internal conductors, which are connected to each other via the coupling electrode to have the same polarity, and the second internal conductor sandwiched by the pair of first internal conductors. Moreover, the pair of first internal conductors that have the bent portions to be formed in a meandering shape are connected to each other via the coupling electrode, so that current flow routes are made long. Accordingly, the pair of first internal conductors form appropriate size of inductance and resistance. This combined with the capacitance obtained by the dielectric layers realizes a function as a distributed constant filter.

As described above, according to this mode, the feedthrough capacitor is used as a basic structure and the effect of the distributed constant filter is imparted, so that it is possible to obtain a noise filter with an improved noise filtering effect.

As a modification example of the noise filter according to the above-described mode of the present invention, conceivable is a structure such that the second internal conductor is also disposed at a position outside the pair of first internal conductors across the dielectric layer.

Therefore, according to this modification example, not only the same operation as that of the above-described mode is brought about but also larger capacitance is obtained since the number of the dielectric layers interposed between the pair of first internal conductors and the second internal conductors is increased. Therefore, it is also possible to realize downsizing of the noise filter since the pair of first internal conductors and the second internal conductors are optimally arranged.

As another modification example of the noise filter according to the above-described mode of the present invention, conceivable is a structure such that the coupling electrode is disposed on a face opposite to the face on which the pair of first terminal electrodes are disposed.

Therefore, according to this modification example, since the coupling electrode is disposed on the face opposite to the face on which the pair of first terminal electrodes are disposed, it is possible to further increase the length of current flow routes of the pair of first internal conductors and to effectively utilize the faces of the dielectric element.

According to another mode of the present invention, provided is a noise filter including: a dielectric element formed of a stack of dielectric layers; a pair of first terminal electrodes disposed on one face of the dielectric element and each connectable to an external circuit; a second terminal electrode disposed on the face on which the pair of first terminal electrodes exist and connectable to the external circuit; a pair of first internal conductors having bent portions respectively and disposed in the dielectric element with both ends thereof being led out outside the dielectric element and with the respective ends thereof on one side being individually connected to the pair of first terminal electrodes; a second internal conductor which is arranged at least between the pair of first internal conductors in the dielectric element, being separated from the pair of first internal conductors by the dielectric layers, and whose one end is led out to the face of the dielectric element to be connected to the second terminal electrode; a third internal conductor having a bent portion and disposed in the dielectric element with both ends thereof being led out outside the dielectric element; and a pair of coupling electrodes disposed on a face of the dielectric element, connecting the other end of one first internal conductor out of the pair of the first internal conductors and one end of the third internal conductor to each other on an outer face of the dielectric element, and connecting the other end of the other first internal conductor and the other end of the third internal conductor to each other on the outer face of the dielectric element.

Such a noise filter has the following operation.

The noise filter according to this mode includes the same structure as that of the noise filter of the mode previously described. It further includes the structure in which the third internal conductor having the bent portion with both ends thereof being led out outside the dielectric element is disposed in the dielectric element, the pair of coupling electrodes are provided, and the other ends of the pair of first internal conductors are connected to each other via the pair of coupling electrodes and the third internal conductor.

Therefore, the existence of the third internal conductor, which is connected to the pair of first internal conductors to have the same polarity as that of the first internal conductors and has the bent portion to be formed in a meandering shape, increases not only capacitance but also inductance and resistance to further improve a noise filtering effect.

According to still another mode of the present invention, provided is a noise filter including: a dielectric element formed of a stack of dielectric layers; a pair of first terminal electrodes disposed on one face of the dielectric element and each connectable to an external circuit; a second terminal electrode disposed on the face on which the pair of first terminal electrodes exist and connectable to the external circuit; a pair of first internal conductors having bent portions respectively, and disposed in the dielectric element with both ends thereof being led out outside the dielectric element and with the respective ends on one side of the pair of first terminal electrodes being individually connected to the pair of first terminal electrodes; a coupling electrode disposed on a face of the dielectric element and connecting the other ends of the pair of first internal conductors to each other on an outer face of the dielectric element; a second internal conductor which is arranged at least between the pair of first internal conductors in the dielectric element, being separated from the pair of first internal conductors by the dielectric layers, and whose one end is led out to the face of the dielectric element to be connected to the second terminal electrode; and a plurality of multilayer blocks each formed of the dielectric layers, the pair of first internal conductors, and the second internal conductor, and housed in the dielectric element.

Such a filter has the following operation.

The noise filter according to this mode includes the same structure as that of the noise filter of the modes previously described. It further includes the structure in which the multilayer block is constituted of the pair of first internal conductors and the second internal conductor including the dielectric layers, and the plural multilayer blocks are housed in the dielectric element.

Therefore, according to this mode, since the dielectric element houses the plural multilayer blocks each constituted of the pair of first internal conductors and the second internal conductor, it is possible to obtain an arrayed noise filter having effects of a plurality of distributed constant filters.

BRIEF DESCRIPTION OF THE DRAWINGS

FIG. 9(A) is a chart showing a signal waveform when a noise filter of a conventional example is used in a digital signal circuit, and FIG. 9(B) is a chart showing a signal waveform when the noise filter according to the first embodiment is used in the digital signal circuit;

FIG. 19 is an exploded perspective view of a noise filter according to a fifth embodiment of the present invention;

DETAILED DESCRIPTION OF THE PREFERRED EMBODIMENTS

Hereinafter, a first embodiment of the noise filter according to the present invention will be described based on the drawings.

As shown in FIG. 1 to FIG. 8, a noise filter 10 being a feedthrough capacitor according to the first embodiment of the present invention includes, as a major portion thereof, a dielectric element 12 being a multilayer body in a rectangular parallelepiped shape which is obtained by sintering a stack of a plurality of ceramic green sheets being dielectric sheets.

Figure 1:
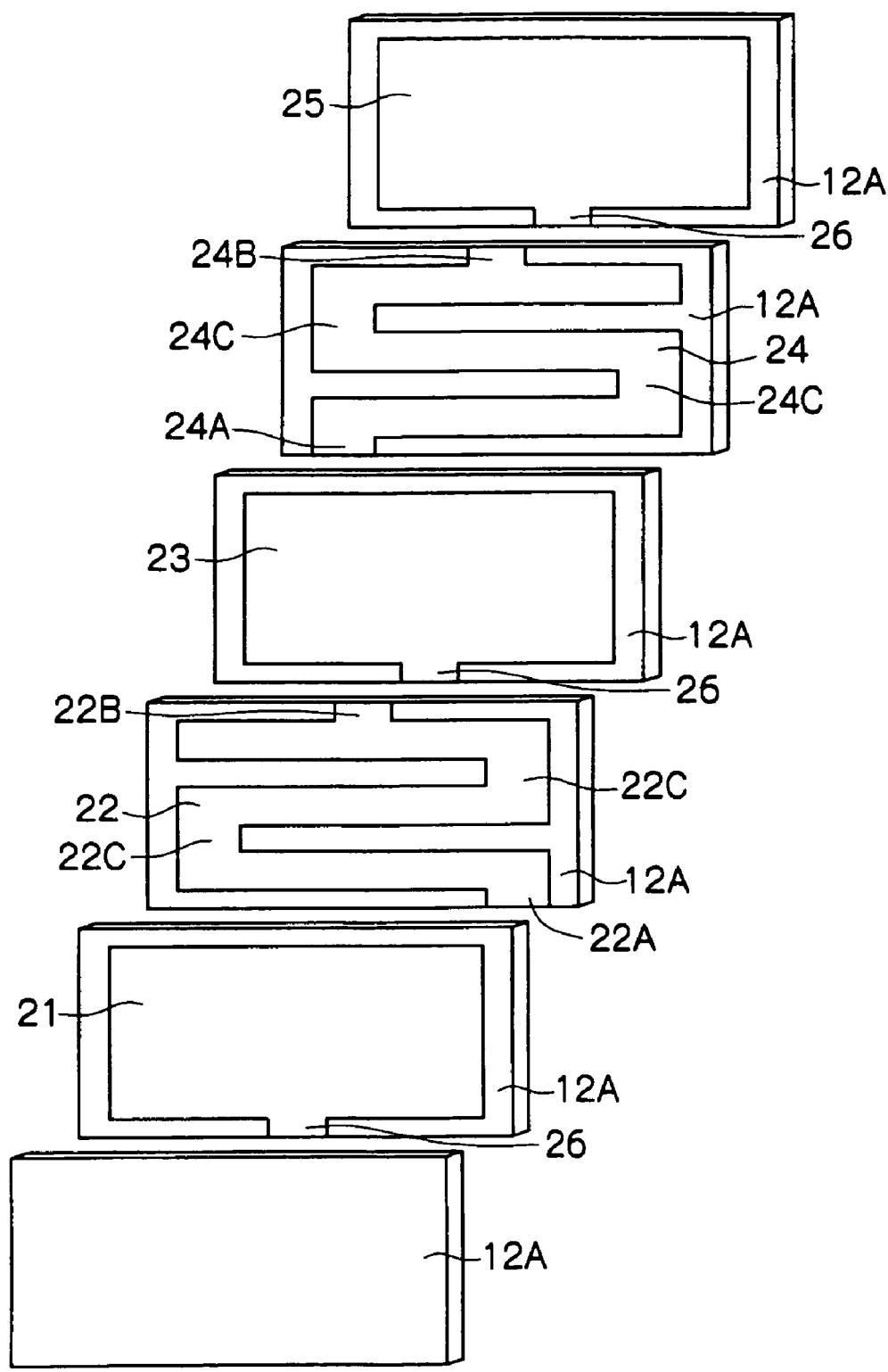
FIG. 1 is an exploded perspective view of a noise filter according to a first embodiment of the present invention.

As shown in FIG. 1, a ceramic layer 12A without any internal conductor is disposed as a protective layer at a front end in the dielectric element 12, and a planar internal conductor 21 is disposed at a position in the dielectric element 12 at the back of the ceramic layer 12A. An internal conductor 22 is disposed at the back of the internal conductor 21 in the dielectric element 12 across the ceramic layer 12A being a sintered ceramic green sheet and serving as a dielectric layer. The internal conductor 22 has a plurality of bent portions 22C being bent portions of the conductor, and is formed in a long and narrow meandering shape.

At the back of the internal conductor 22 across a ceramic layer 12A in the dielectric element 12, an internal conductor 23 similarly in a planar shape is disposed. Similarly, at the back of the internal conductor 23 across a ceramic layer 12A in the dielectric element 12, disposed is an internal conductor 24 that has a plurality of bent portions 24C being bent portions of the conductor and is formed in a long and narrow meandering shape. At the back of the internal conductor 24 across a ceramic layer 12A in the dielectric element 12, a planar internal conductor 25 is further disposed.

Therefore, five internal conductors, namely the internal conductors 21 to 25 are arranged in the dielectric element 12 to face each other, being separated from each other by the ceramic layers 12A. Among them, the centers of the planar internal conductors 21, 23, 25 are substantially aligned with the centers of the respective ceramic layers 12A. The length and width dimensions of the internal conductors 21, 23, 25 are made smaller than the lengths of corresponding sides of the ceramic layers 12A respectively.

One end of the internal conductor 22 is a leadout portion 22A led out toward a rightward position of a lower edge of the ceramic layer 12A, and the other end of the internal conductor 22 is a leadout portion 22B led out toward a center of an upper edge of the ceramic layer 12A. Further, one end of the internal conductor 24 is a leadout portion 24A led out toward a leftward position of a lower edge of the ceramic layer 12A, and the other end of the internal conductor 24 is a leadout portion 24B led out toward a center of an upper edge of the ceramic layer 12A.

From a lower side of each of the planar internal conductors 21, 23, 25, one portion of the conductor is led out toward a center of a lower edge of the ceramic layer 12A to be a leadout portion 26, so that this leadout portion 26 corresponds to one end led out from each of the internal conductors 21, 23, 25.

Figure 2:
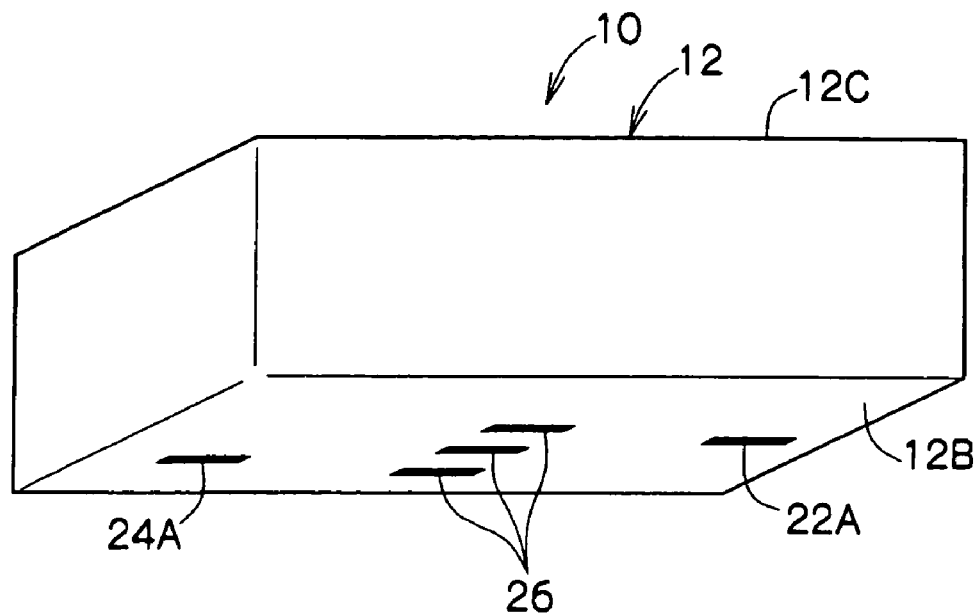
FIG. 2 is a perspective view of the noise filter according to the first embodiment of the present invention seen from the bottom before terminal electrodes are mounted thereon.
Figure 4:
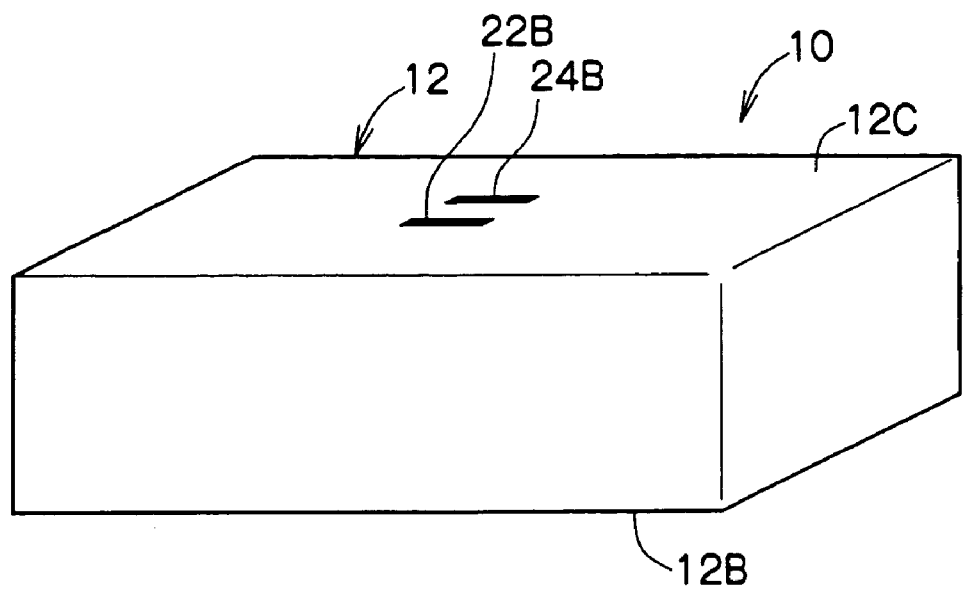
FIG. 4 is a perspective view of the noise filter according to the first embodiment of the present invention seen from the top before a coupling electrode is mounted thereon.

Therefore, in this embodiment, as shown in FIG. 2 and FIG. 4, the leadout portions 22A, 22B corresponding to both ends of the internal conductor 22 and the leadout portions 24A, 24B corresponding to both ends of the internal conductor 24 are led out to two upper and lower faces 12B, 12C opposite to each other out of four faces of the dielectric element 12, respectively. Further, the leadout portions 26 each corresponding to one end of each of the internal conductors 21, 23, 25 are led out to the lower face 12B out of the four faces of the dielectric element 12 respectively.

Figure 3:
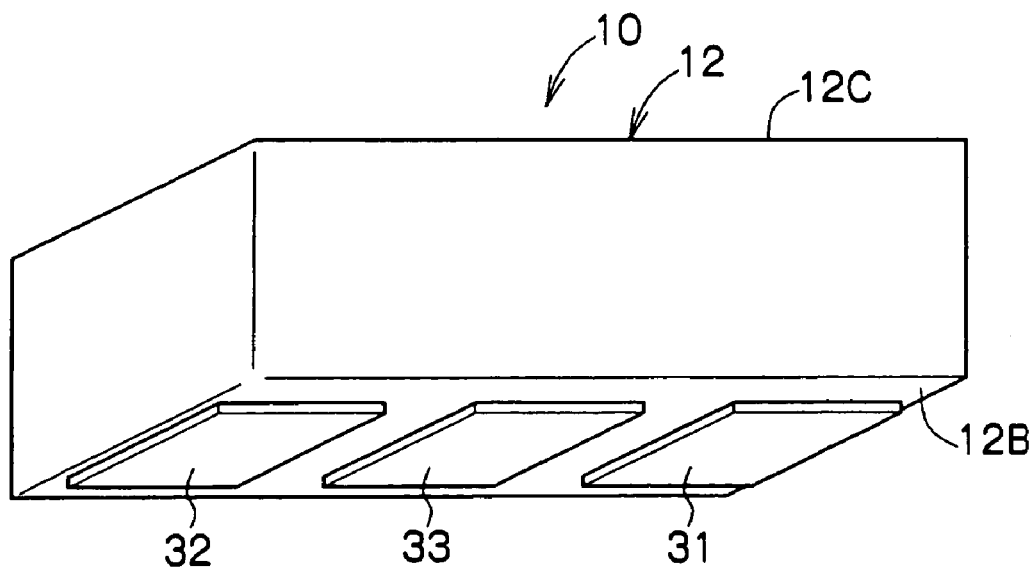
FIG. 3 is a perspective view of the noise filter according to the first embodiment of the present invention seen from the bottom.

A signal terminal electrode 31 connected to the leadout portion 22A of the internal conductor 22 is disposed on a rightward portion of the lower face 12B in FIG. 3 that is an outer face of the dielectric element 12. A signal terminal electrode 32 connected to the leadout portion 24A of the internal conductor 24 is further disposed on a leftward portion of the lower face 12B in FIG. 3 that is the outer face of the dielectric element 12. A grounding terminal electrode 33 integrally connected to the leadout portions 26 of the internal conductors 21, 23, 25 is disposed on a center portion of the lower face 12B in FIG. 3 that is the outer face of the dielectric element 12.

Figure 5:
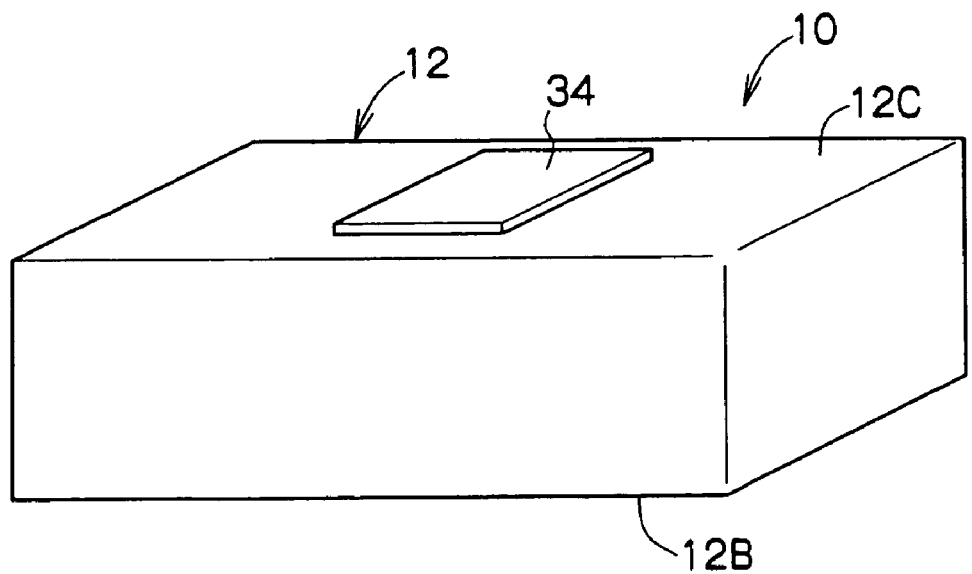
FIG. 5 is a perspective view of the noise filter according to the first embodiment of the present invention seen from the top.

On a center portion of the upper face 12C in FIG. 5 that is an outer face of the dielectric element 12, a coupling electrode 34 connected to the leadout portion 22B of the internal conductor 22 and the leadout portion 24B of the internal conductor 24, which are shown in FIG. 4, is disposed. In other words, the coupling electrode 34 connects these leadout portions 22B, 24B to each other to connect the internal conductor 22 and the internal conductor 24 in series.

Note that this coupling electrode 34 is intended only for connecting the internal conductors 22, 24 to each other outside the dielectric element 12 and thus is not connected to an external circuit.

As described above, in this embodiment, the signal terminal electrodes 31, 32 and the grounding terminal electrode 33, and the coupling electrode 34 are respectively disposed on the two faces 12B, 12C out of the four faces of the dielectric element 12, which is formed in a hexahedron shape being a rectangular parallelepiped shape, of the noise filter 10.

These signal terminal electrodes 31, 32 correspond to a pair of first terminal electrodes and the grounding terminal electrode 33 corresponds to a second terminal electrode, both being connectable to an external circuit. Therefore, the noise filter 10 according to this embodiment is structured such that resistors R, an inductance L, and a capacitor C are provided among these terminal electrodes as shown in an equivalent circuit diagram shown in FIG. 8.

Figure 7:
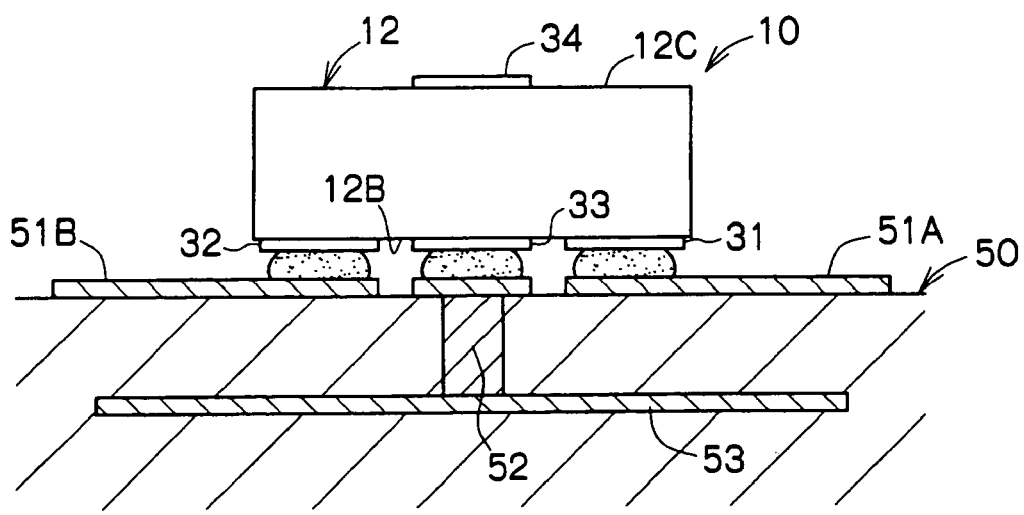
FIG. 7 is a cross-sectional view showing the state when the noise filter according to the first embodiment of the present invention is mounted on a printed board.
Figure 8:
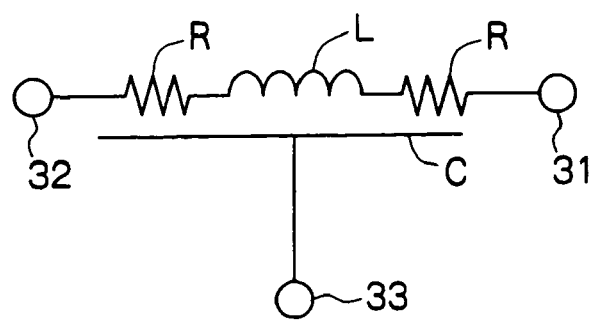
FIG. 8 is an equivalent circuit diagram of the noise filter according to the first embodiment of the present invention.

With the above-described structure, the noise filter 10 of this embodiment is mounted on a substrate to be used in, for example, a digital signal circuit. Note that when it is used, the pair of signal terminal electrodes 31, 32 are connectable to signal lines 51A, 51B of a multilayer printed board 50, and the grounding terminal electrode 33 is connectable to a ground layer 53 via a through hole 52 of the printed board 50, as shown in FIG. 7. Accordingly, the internal conductors 21 to 25 in the dielectric element 12 are set perpendicular to a surface of the printed board 50.

In short, in this embodiment, the internal conductors 22, 24 corresponding to first internal conductors form signal transmission routes, and the internal conductors 21, 23, 25 corresponding to a second internal conductor form routes leading to a ground side. Further, the internal conductors 21 to 25 and the ceramic layers 12A constitute a capacitor. Note that as a material of these internal conductors, for example, nickel, a nickel alloy, copper, or a copper alloy is conceivable.

Next, the operation of the noise filter 10 of this embodiment will be described.

In the noise filter 10 according to this embodiment, the pair of internal conductors 22, 24 which have the bent portions 22C, 24C and whose both ends are led out outside the dielectric element 12, and the internal conductor 23 which exists between the pair of internal conductors 22, 24, being separated from the internal conductors 22, 24 by the ceramic layers, are arranged in the dielectric element 12 formed of a stack of the ceramic layers 12A.

Further, the internal conductors 21, 25 exist outside the pair of internal conductors 22, 24 across the ceramic layers 12A, and these internal conductors 21, 25 are arranged in the dielectric element 12 formed of a stack of the ceramic layers 12A similarly to the above.

The respective ends on one side of the pair of internal conductors 22, 24 are individually connected to the pair of signal terminal electrodes 31, 32 disposed on the lower face 12B which is one face of the dielectric element 12. The coupling electrode 34 disposed on the upper face 12C of the dielectric element 12 opposite to the face 12B on which the pair of signal terminal electrodes 31, 32 are disposed connects the other ends of the pair of internal conductors 22, 24 to each other on the outer face of the dielectric element 12.

On the face 12B of the dielectric element 12 on which the pair of signal terminal electrodes 31, 32 exist, the grounding terminal electrode 33 is disposed, and in addition, the respective ends on one side of the internal conductors 21, 23, 25 are led out to this face 12B. Therefore, the respective ends on one side of the internal conductors 21, 23, 25 are connected to the grounding terminal electrode 33. Accordingly, the pair of signal terminal electrodes 31, 32 and the grounding terminal electrode 33 are connected to, for example, the printed board 50 shown in FIG. 7 which is an external circuit.

Therefore, in this embodiment, capacitance is obtained by the pair of internal conductors 22, 24 which are connected to each other via the coupling electrode 34 to have the same polarity, by the internal conductors 21, 23, 25 alternately arranged with the pair of internal conductors 22, 24, and by the ceramic layers 12A interposed among the internal conductors 21 to 25.

Further, the pair of internal conductors 22, 24 that have the bent portions 22C, 24C to be formed in a meandering shape are connected to each other via the coupling electrode 34, so that current flow routes are made long. Accordingly, the pair of internal conductors 22, 24 form an appropriate size of inductance and resistance. This combined with the capacitance obtained by the ceramic layers 12A allows the noise filter 10 according to this embodiment to function as a distributed constant filter.

With the above-described structure, according to this embodiment, a feedthrough capacitor is used as its base structure and an effect of the distributed constant filter is imparted, which makes it possible to obtain the noise filter 10 with an improved noise filtering effect.

In this embodiment, the coupling electrode 34 is disposed on the face 12C opposite to the face 12B on which the pair of signal terminal electrodes 31, 32 are disposed. This structure can further lengthen the current flow routes of the pair of internal conductors 22, 24 and allows effective use of the faces of the dielectric element 12.

Figure 6:
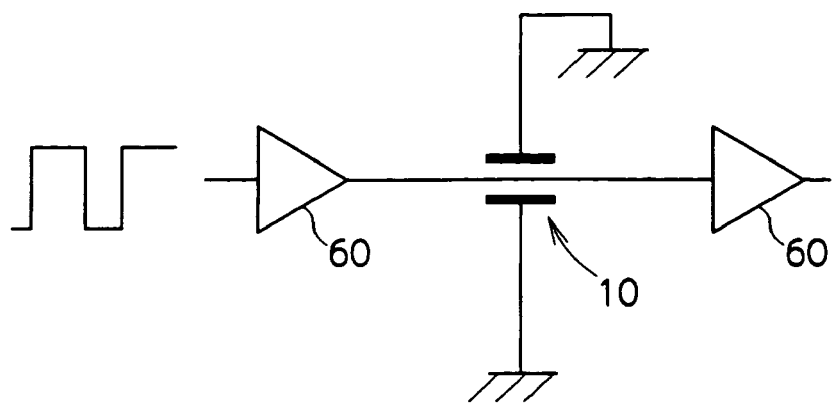
FIG. 6 is an explanatory diagram showing a usage example of the noise filter according to the first embodiment of the present invention.

The noise filter 10 according to this embodiment is used in, for example, a digital signal circuit in FIG. 6 showing a usage example thereof and is disposed between digital elements 60. FIG. 9(A) shows a signal waveform when a noise filter according to a conventional feedthrough capacitor is used in this digital signal circuit. Compared with the signal waveform shown in FIG. 9(A), a better waveform with reduced overshoot and undershoot is obtained as shown in FIG. 9(B) when the noise filter 10 according to this embodiment is used. Therefore, it is understood from the signal waveforms in FIG. 9(A) and FIG. 9(B) that the effect of this embodiment is higher.

Next, a second embodiment of the noise filter according to the present invention will be described based on FIG. 10 to FIG. 12. The same reference numerals and symbols are used to designate the same members as those described in the first embodiment, and repeated description thereof will be omitted.

Figure 10:
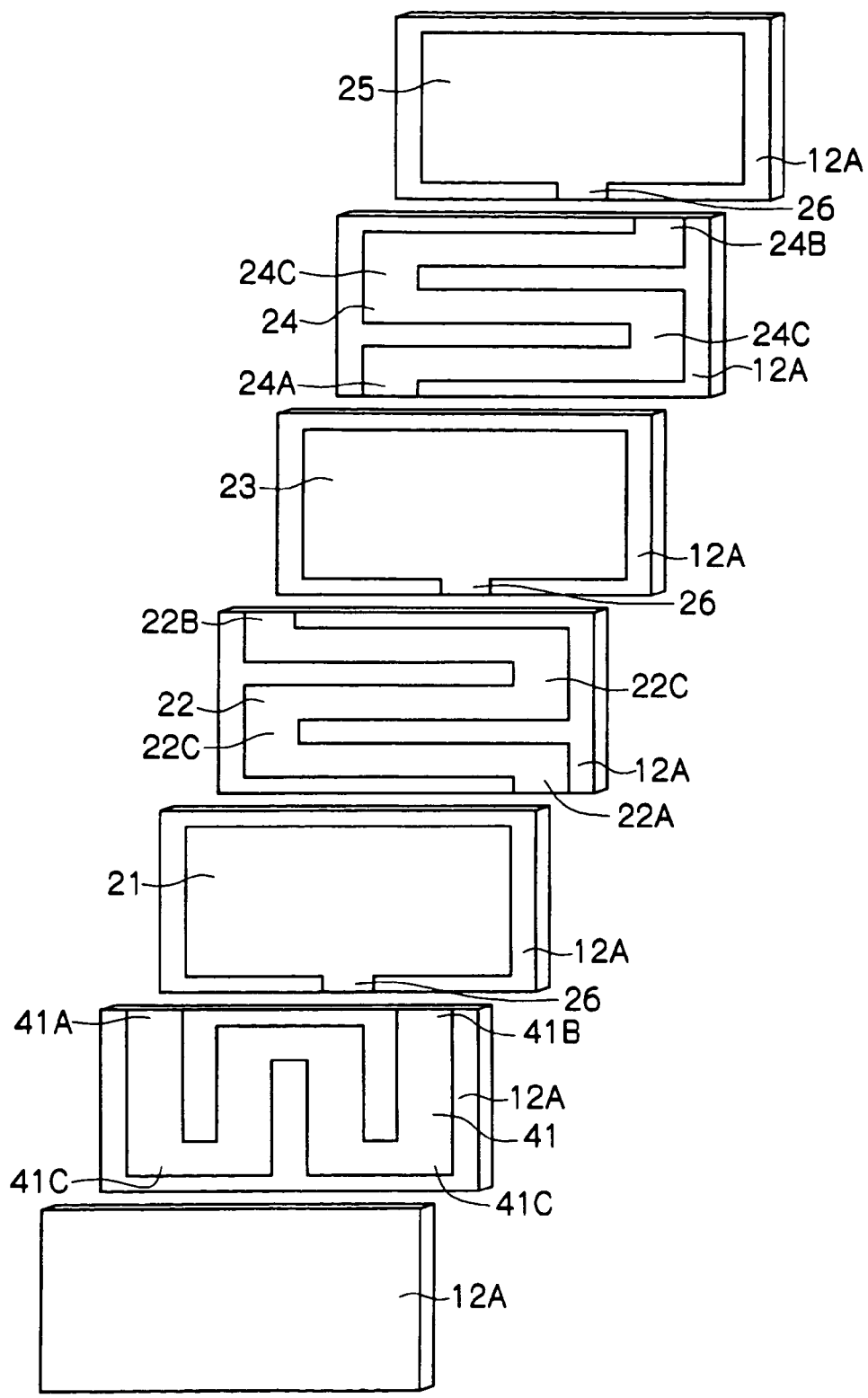
FIG. 10 is an exploded perspective view of a noise filter according to a second embodiment of the present invention.

As shown in FIG. 10, in this embodiment, an internal conductor 41 corresponding to a third internal conductor is disposed at a position in a dielectric element 12 in front of an internal conductor 21 having the same structure as that in the first embodiment. The internal conductor 41 has a plurality of bent portions 41C that are bent portions of the conductor, with both ends thereof being led out outside the dielectric element 12. Therefore, the internal conductor 21 is disposed at a position in the dielectric element 12 at the back of the internal conductor 41 across a ceramic layer 12A.

Specifically, the internal conductor 41 is bent in a "W" shape due to the plural bent portions 41C to have a key shape, and leadout portions 41A, 41B corresponding to both ends thereof are led out toward leftward and rightward positions of an upper edge of the ceramic layer 12A. Accordingly, the other end of the internal conductor 22 of this embodiment is a leadout portion 22B led out toward a leftward position of an upper edge of a ceramic layer 12A. The other end of the internal conductor 24 of this embodiment is a leadout portion 24B led out toward a rightward position of an upper edge of a ceramic layer 12A.

Figure 11:
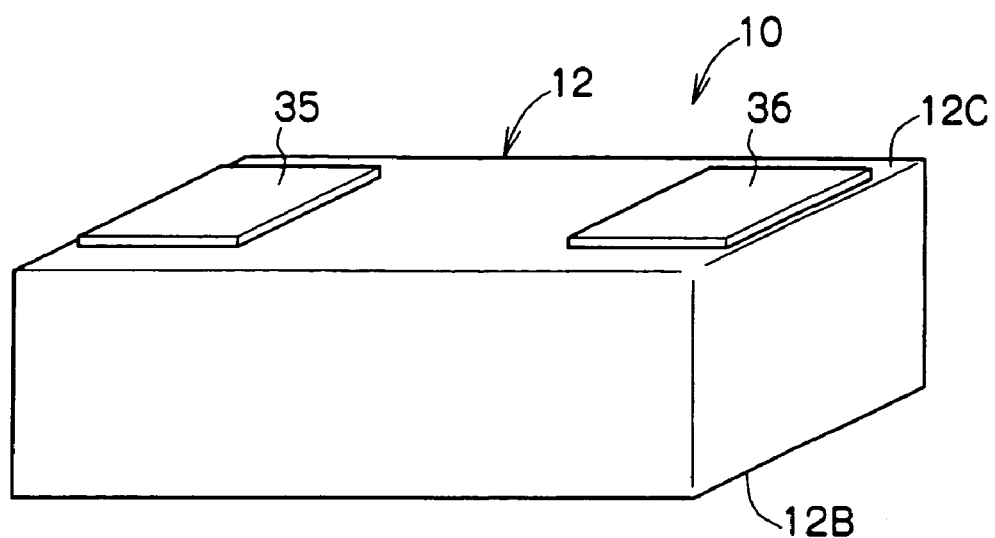
FIG. 11 is a perspective view of the noise filter according to the second embodiment of the present invention seen from the top.

Further, in this embodiment, in place of the coupling electrode 34 of the first embodiment, a pair of coupling electrodes 35, 36 exist on an upper face 12C of the dielectric element 12, being arranged on left and right portions of this upper face 12C respectively, as shown in FIG. 11.

This means that the coupling electrode 35 connects the leadout portions 41A, 22B to each other, and the coupling electrode 36 connects the leadout portions 41B, 24B to each other. Consequently, the other end of the internal conductor 22 and the other end of the internal conductor 24 are connected to each other via the pair of coupling electrodes 35, 36 and the internal conductor 41, so that these internal conductors 22, 24 are connected in series.

Figure 12:
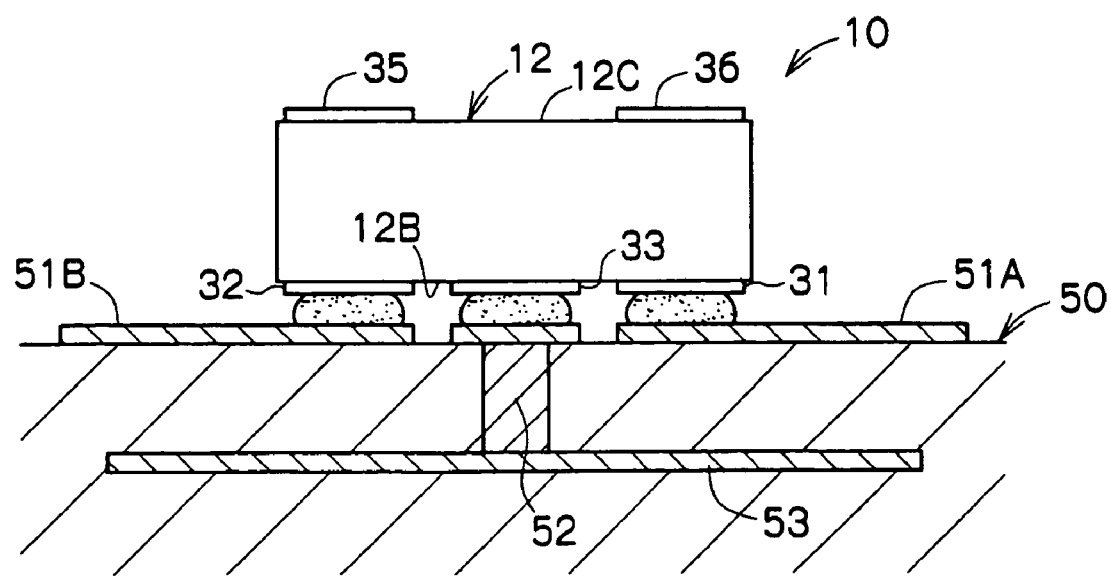
FIG. 12 is a cross-sectional view showing the state when the noise filter according to the second embodiment of the present invention is mounted on a printed board.

The noise filter 10 of this embodiment is also structured such that a pair of signal terminal electrodes 31, 32 are connectable to signal lines 51A, 51B of a multilayer printed board 50, and a grounding terminal electrode 33 is similarly connectable to a ground layer 53 via a through hole 52 of the printed board 50, as shown in FIG. 12.

With the structure described above, the noise filter 10 according to this embodiment includes the internal conductor 41 that is connected to the pair of internal conductors 22, 24 to have the same polarity as the polarity of the internal conductors 22, 24 and that has the bent portions 41C to be formed in a meandering shape. This structure increases not only capacitance but also inductance and resistance, resulting in a further improved noise filtering effect.

Next, a third embodiment of the noise filter according to this embodiment will be described based on FIG. 13. The same reference numerals and symbols are used to designate the same members as those described in the first embodiment, and repeated explanation thereof will be omitted.

Figure 13:
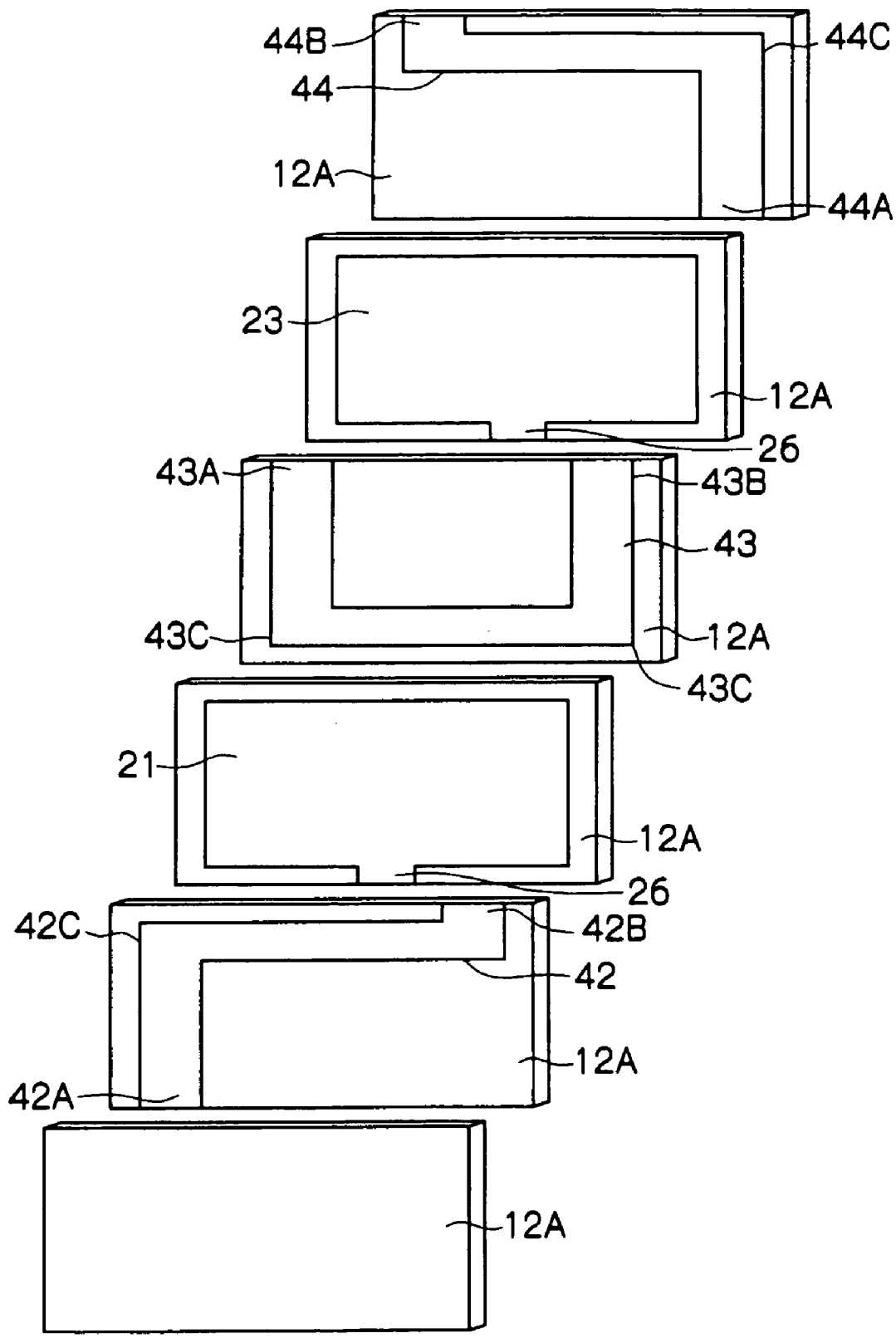
FIG. 13 is an exploded perspective view of a noise filter according to a third embodiment of the present invention.

As shown in FIG. 13, in this embodiment similarly to the second embodiment, an internal conductor 42 corresponding to a first internal conductor which has a bent portion 42C being a bent portion of the conductor to be formed in an "L" shape and whose both ends are led out outside a dielectric element 12 is disposed at a position in front of an internal conductor 21 in the dielectric element 12.

Specifically, a leadout portion 42A which is one end of the internal conductor 42 is led out toward a leftward position of a lower edge of a ceramic layer 12. A leadout portion 42B which is the other end of the internal conductor 42 is led out toward a rightward position of an upper edge of the ceramic layer 12A. Further, an internal conductor 43 corresponding to a third internal conductor which has a plurality of bent portions 43C to be formed in a "U" shape and whose both ends are led out outside the dielectric element 12 is disposed at the back of the internal conductor 21 in the dielectric element 12. In short, the leadout portions 43A, 43B which are both ends of the internal conductor 43 are led out toward the leftward and rightward positions of the upper edge of the ceramic layer 12A respectively.

An internal conductor 23 similar to that of the first embodiment is disposed at a position in the dielectric element 12 at the back of the internal conductor 43 across a ceramic layer 12A. At the back of this internal conductor 23 across a ceramic layer 12A, an internal conductor 44 corresponding to a first internal conductor which has a bent portion 44C being a bent portion of the conductor to be formed in an "L" shape and whose both ends are led out outside the dielectric element 12 is disposed. Specifically, a leadout portion 44A which is one end of the internal conductor 44 is led out toward a rightward position of a lower edge of the ceramic layer 12A. A leadout portion 44B which is the other end of the internal conductor 44 is led out toward a leftward position of an upper edge of the ceramic layer 12A.

In this embodiment as in the second embodiment, a pair of coupling electrodes 35, 36 also exist on an upper face 12C of the dielectric element 12, being disposed in left and right portions of this upper face 12C respectively. The coupling electrode 35 connects the readout portions 43A, 44B to each other, and the coupling electrode 36 connects the leadout portions 42B, 43B to each other. Consequently, the other end of the internal conductor 42 and the other end of the internal conductor 44 are connected to each other via the pair of coupling electrodes 35, 36 and the internal conductor 43, so that these internal conductors 42, 44 are connected in series.

With the structure described above, the noise filter 10 according to this embodiment has the internal conductor 43 that is connected to the pair of internal conductors 42, 44 to have the same polarity as that of the internal conductors 42, 44 and that has the bent portion 43C to be formed in a meandering shape. This structure increases not only capacitance but also inductance and resistance to further improve a noise filtering effect, similarly to the second embodiment.

Next, a fourth embodiment of the noise filter according to the present invention will be described based on FIG. 14 to FIG. 18. The same reference numerals and symbols are used to designate the same members as those described in the first embodiment, and repeated description thereof will be omitted.

Figure 14:
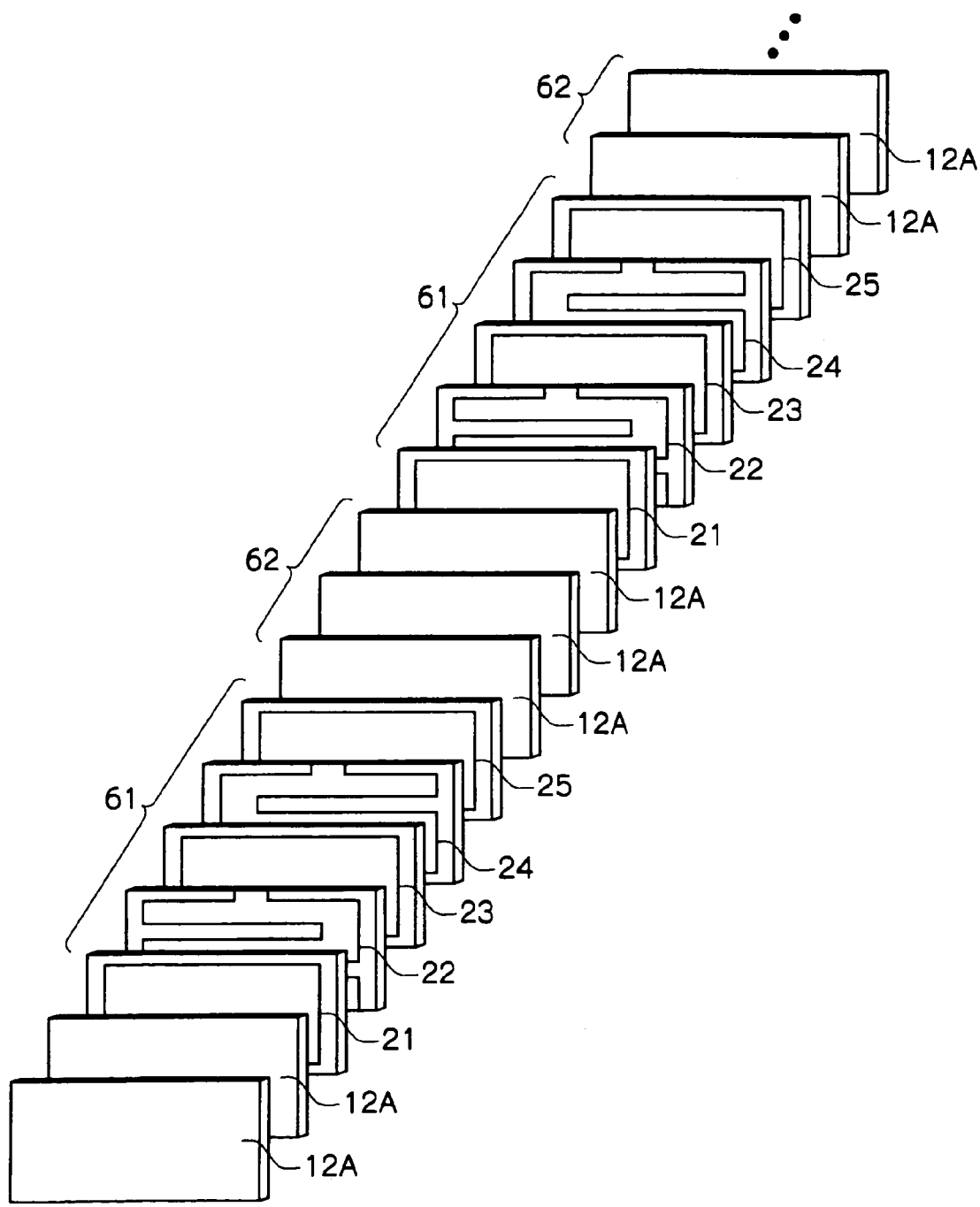
FIG. 14 is an exploded perspective view of a noise filter according to a fourth embodiment of the present invention.
Figure 15:
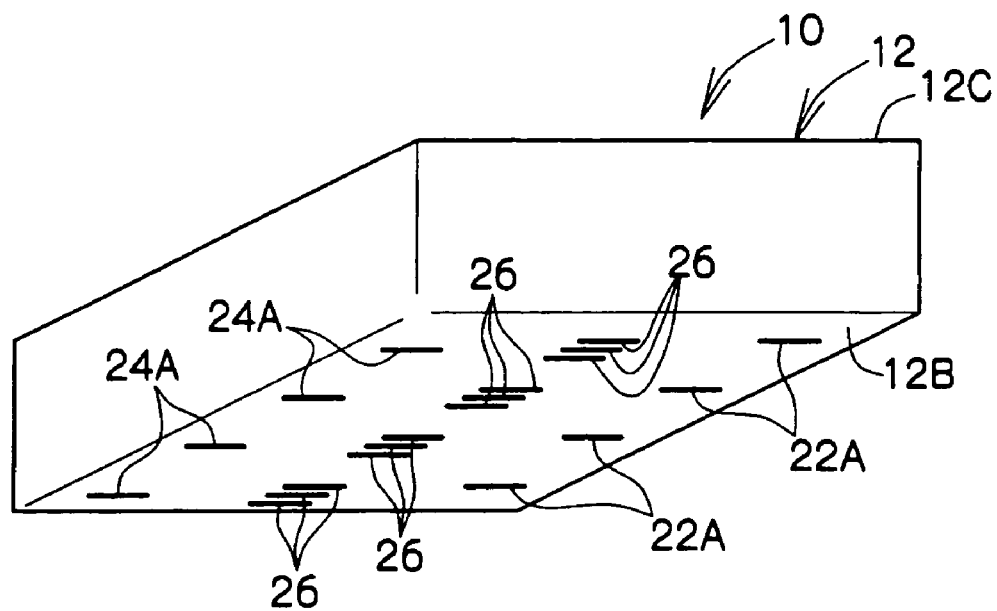
FIG. 15 is a perspective view of the noise filter according to the fourth embodiment of the present invention seen from the bottom before terminal electrodes are mounted thereon.

As shown in FIG. 14, in this embodiment, a multilayer block 61 is constituted of a pair of internal conductors 22, 24 and internal conductors 21, 23, 25 including ceramic layers 12A having the same structure as that of the first embodiment. The plural multilayer blocks 61 are housed in a dielectric element 12 shown in FIG. 15 and FIG. 17 so that the plural multilayer blocks 61 are arranged to sandwich an intermediate layer 62 formed of ceramic layers 12A without any internal conductor.

Figure 16:
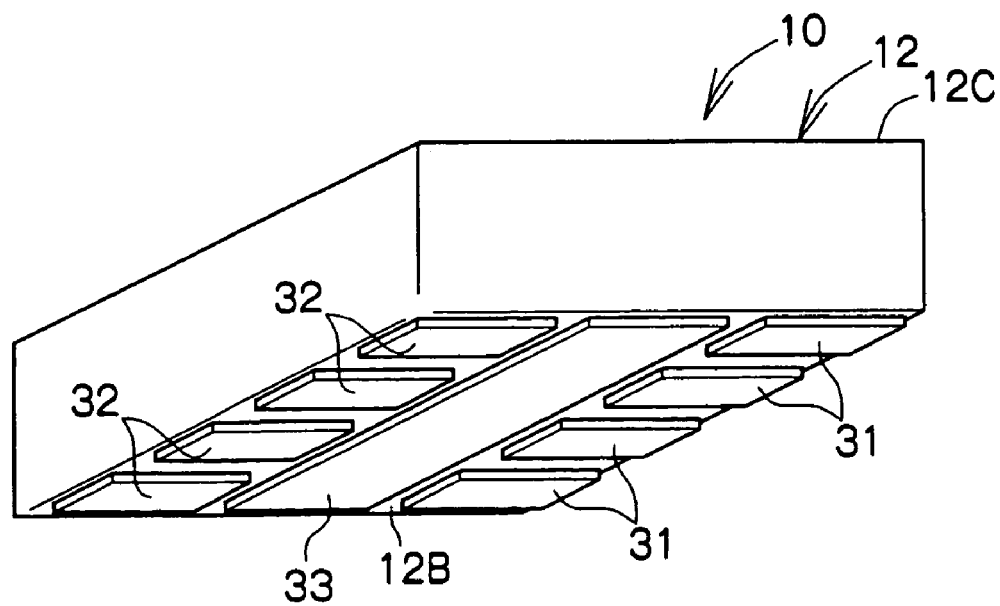
FIG. 16 is a perspective view of the noise filter according to the fourth embodiment of the present invention seen from the bottom.
Figure 17:
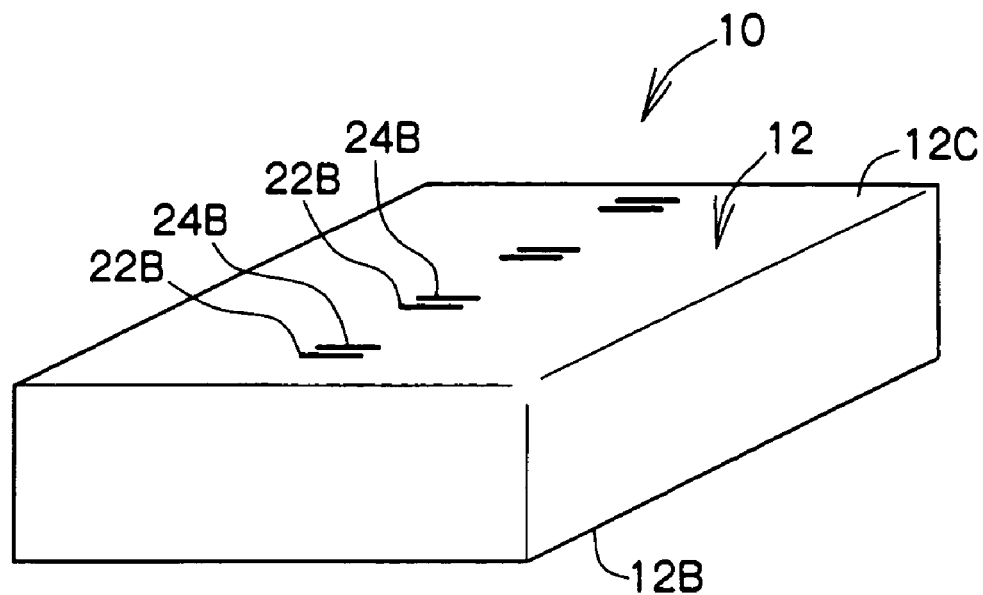
FIG. 17 is a perspective view of the noise filter according to the fourth embodiment of the present invention seen from the top before a coupling electrode is mounted thereon.
Figure 18:
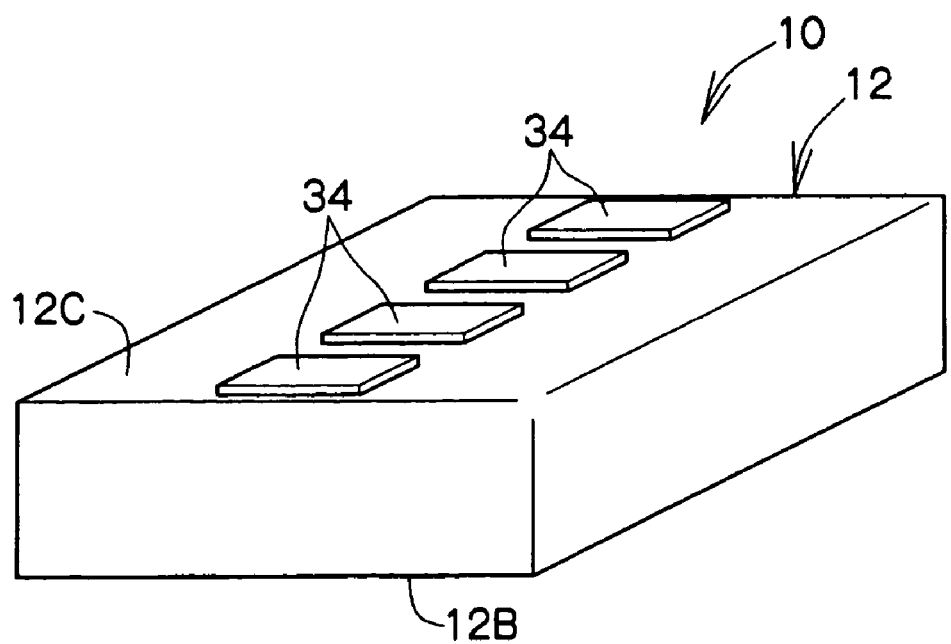
FIG. 18 is a perspective view of the noise filter according to the fourth embodiment of the present invention seen from the top.

Accordingly, in this embodiment, a plurality of signal terminal electrodes 31 and a plurality of signal terminal electrodes 32 are disposed on a lower face 12B in FIG. 16 of the dielectric element 12 so as to correspond to the number of the multilayer blocks 61. A plurality of coupling electrodes 34 are disposed on an upper face 12C in FIG. 18 of the dielectric element 12. Note that a grounding terminal electrode 33 in an integrated form is disposed on the lower face 12B in FIG. 16 to connect the multilayer blocks 61 to one another.

Therefore, according to this embodiment, the plural multilayer blocks 61 each constituted of the pair of internal conductors 22, 24 and the internal conductors 21, 23, 25 are housed in the dielectric element 12. With this structure, in this embodiment, the arrayed noise filter 10 having effects of a plurality of distributed constant filters each functioning independently is obtained.

Next, a fifth embodiment of the noise filter according to the present invention will be described based on FIG. 19 and FIG. 20. The same reference numerals and symbols are used to designate the same members as those described in the first embodiment, and repeated explanation thereof will be omitted.

As shown in FIG. 19, this embodiment includes the same structure as that of the first embodiment, but in place of the internal conductor 22, an internal conductor 45 corresponding to a first internal conductor having a plurality of bent portions 45C and an internal conductor 46 corresponding to a capacitor internal conductor in a planar shape are arranged on the same surface. Further, in place of the internal conductor 24, an internal conductor 47 corresponding to a first internal conductor having a plurality of bent portions 47C and an internal conductor 48 corresponding to a capacitor internal conductor in a planar shape are arrange on the same surface.

The signal terminal electrode 31 shown in FIG. 3 connects the internal conductor 46 and the internal conductor 47 to each other, and the signal terminal electrode 32 connects the internal conductor 45 and the internal conductor 48 to each other.

Figure 20:
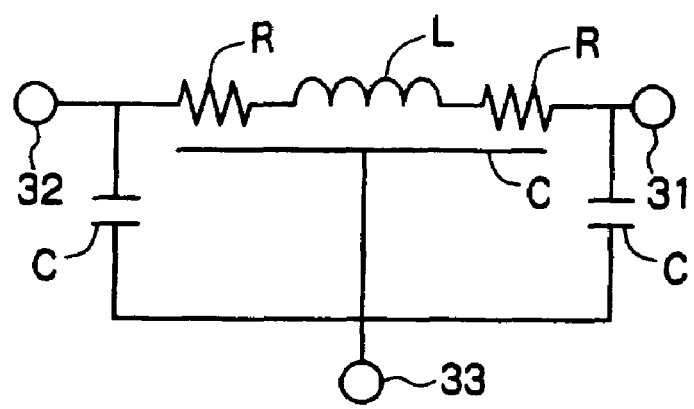
FIG. 20 is an equivalent circuit diagram of the noise filter according to the fifth embodiment of the present invention.
Figure 21:
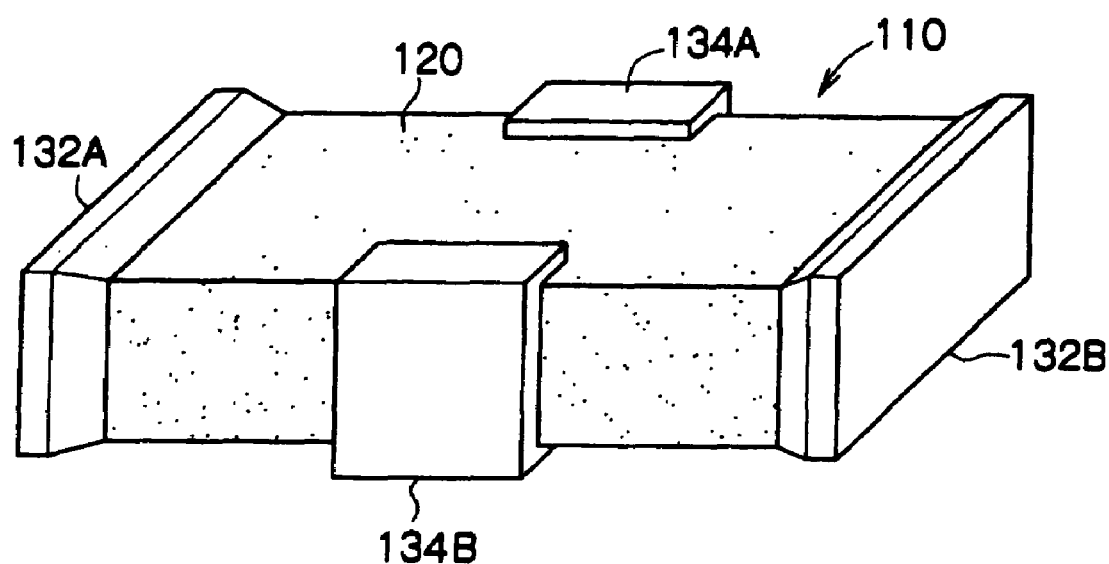
FIG. 21 is a perspective view of a multilayer feedthrough capacitor according to a conventional example.
Figure 22:
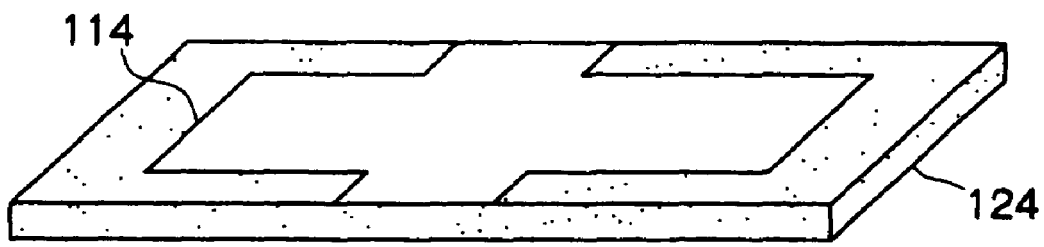
FIG. 22(A) is an exploded partial view of the multilayer feedthrough capacitor of the conventional example and is a perspective view of a dielectric sheet having a second internal conductor connectable to a ground side.
FIG. 22(B) is an exploded partial view of the multilayer feedthrough capacitor of the conventional example and is a perspective view of a dielectric sheet having a first internal conductor connectable to a signal line side.
FIG. 22(C) is an exploded partial view of the multilayer feedthrough capacitor of the conventional example and is a perspective view of a dielectric sheet having a second internal conductor connectable to the ground side.
Figure 22:
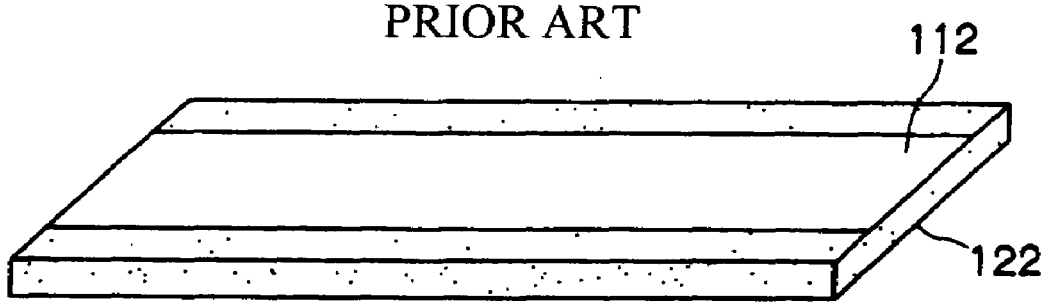
Figure 22:
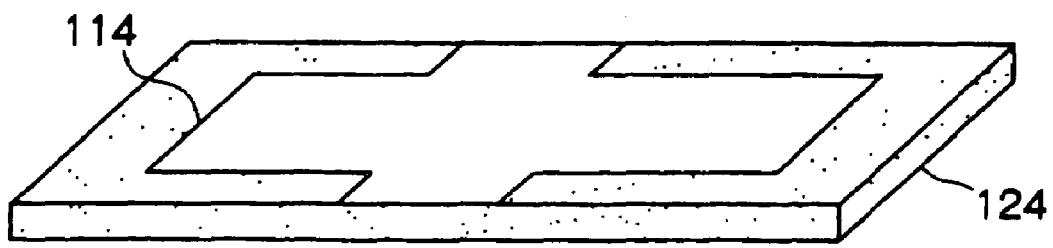
Figure 23:
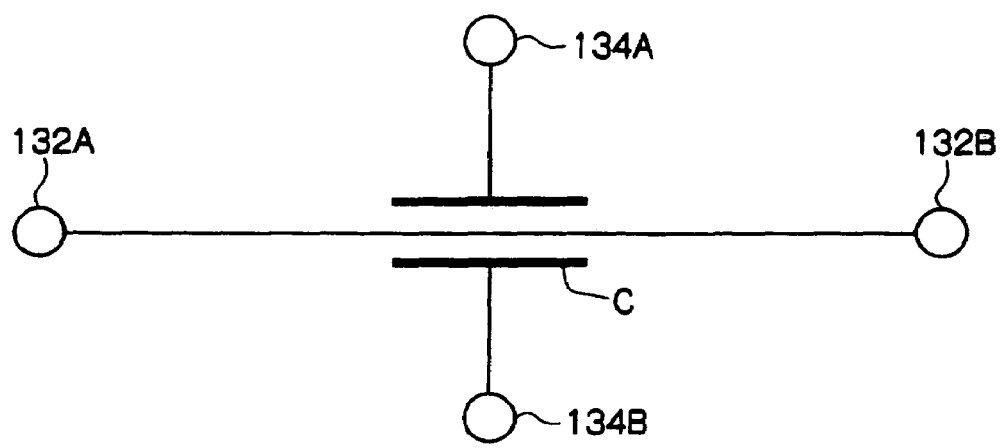
FIG. 23 is an equivalent circuit diagram of the multilayer feedthrough capacitor according to the conventional example.

Therefore, compared with the equivalent circuit diagram of the first embodiment, a pair of capacitors C are added and arranged as in an equivalent circuit diagram shown in FIG. 20 in this embodiment. This realizes the noise filter 10 with a higher function.

According to the present invention, a feedthrough capacitor is used as its basic structure and the effect of a distributed constant filter is imparted, so that it is possible to obtain a noise filter with an improved noise filtering effect.

What is claimed is:

1. A noise filter comprising:
a dielectric element formed of a stack of dielectric layers;
a pair of first terminal electrodes disposed on one face of the dielectric element and each connectable to an external circuit;
a second terminal electrode disposed on the face on which the pair of first terminal electrodes exist and connectable to the external circuit;
a pair of first internal conductors having bent portions respectively and disposed in the dielectric element with both ends thereof being led out outside the dielectric element and with the respective ends thereof on one side being led out to different portions from each other and individually connected to the pair of first terminal electrodes;
a coupling electrode disposed on a face of the dielectric element opposite to the face on which the pair of first terminal electrodes are disposed, and connecting the other ends of the pair of first internal conductors each other; and
a second internal conductor which is arranged at least between the pair of first internal conductors in the dielectric element, being separated from the pair of first internal conductors by the dielectric layers, and whose one end is led out to the face of the dielectric element to be connected to the second terminal electrode.

2. The noise filter according to claim 1, wherein the second internal conductor is also disposed at a position outside the pair of first internal conductors across the dielectric layer.

3. The noise filter according to claim 1, wherein each of the pair of first internal conductors has the plural bent portions.

4. The noise filter according to claim 1, wherein the other ends of the pair of first internal conductors are led out to a same face of the dielectric element.

5. The noise filter according to claim 1, wherein the second internal conductor is formed in a planar shape.

6. The noise filter according to claim 1, wherein the dielectric element is formed of a stack of the plural dielectric layers that are ceramic layers.

7. The noise filter according to claim 1, wherein the noise filter is mountable on a substrate with a plane on which the first internal conductors and the second internal conductor are formed being perpendicular to a surface of the external circuit.

8. The noise filter according to claim 1, wherein a capacitor internal conductor formed in a planar shape is disposed on a same surface on which the first internal conductors are disposed.

9. A noise filter comprising:
a dielectric element formed of a stack of dielectric layers;
a pair of first terminal electrodes disposed on one face of the dielectric element and each connectable to an external circuit;
a second terminal electrode disposed on the face on which the pair of first terminal electrodes exist and connectable to the external circuit;
a pair of first internal conductors having bent portions respectively and disposed in the dielectric element with both ends thereof being led out outside the dielectric element and with the respective ends on one side thereof being individually connected to the pair of first terminal electrodes;
a coupling electrode disposed on a face of the dielectric element and connecting the other ends of the pair of first internal conductors each other;
a second internal conductor which is arranged at least between the pair of first internal conductors in the dielectric element, being separated from the pair of first internal conductors by the dielectric layers, and whose one end is led out to the face of the dielectric element to be connected to the second terminal electrode;
an intermediate layer formed of a dielectric layer without any internal conductor; and
a plurality of multilayer blocks each formed of the dielectric layers, the pair of first internal conductors, and the second internal conductor, and housed in the dielectric element, being stacked with the intermediate layer interposed therebetween.

10. The noise filter according to claim 9, wherein the multilayer block includes the second internal conductor disposed at a position outside the pair of first internal conductors.

11. The noise filter according to claim 9, wherein the coupling electrode is disposed on a face opposite to the face on which the pair of first terminal electrodes are disposed.

* * * * *